US012673866B2

(12) United States Patent
Zheng et al.

(10) Patent No.: US 12,673,866 B2
(45) Date of Patent: Jul. 7, 2026

(54) ATOMIC-SMOOTH DEVICE WITH MICROSTRUCTURE, AND METHOD FOR PREPARING SAME

(71) Applicants: RESEARCH INSTITUTE OF TSINGHUA UNIVERSITY IN SHENZHEN, Guangdong (CN); TSINGHUA UNIVERSITY, Beijing (CN)

(72) Inventors: Quanshui Zheng, Beijing (CN); Xiaojian Xiang, Beijing (CN)

( * ) Notice: Subject to any disclaimer, the term of this patent is extended or adjusted under 35 U.S.C. 154(b) by 704 days.

(21) Appl. No.: 17/923,648

(22) PCT Filed: Jun. 28, 2020

(86) PCT No.: PCT/CN2020/098480
§ 371 (c)(1),
(2) Date: May 16, 2023

(87) PCT Pub. No.: WO2022/000123
PCT Pub. Date: Jan. 6, 2022

(65) Prior Publication Data
US 2023/0271825 A1     Aug. 31, 2023

(51) Int. Cl.
B81C 1/00 (2006.01)
B81B 7/02 (2006.01)

(52) U.S. Cl.
CPC ............ B81C 1/00357 (2013.01); B81B 7/02 (2013.01); *B81B 2201/038* (2013.01);
(Continued)

(58) Field of Classification Search
CPC ..... B82Y 40/00; H01L 21/48; B81C 1/00357; B81C 2201/0102; B81C 2201/0132;
(Continued)

(56) References Cited

U.S. PATENT DOCUMENTS 11,551,921 B1 *  1/2023  McGuinness ....... H01J 49/4255
2001/0051435 A1  12/2001  Mearini et al.
(Continued)

FOREIGN PATENT DOCUMENTS

CN          102684546 A      9/2012
CN          202818150 U      3/2013
(Continued)

OTHER PUBLICATIONS

Chinese Supplemental Search Report issued by the Chinese Patent Office in connection with International Application No. 202080092515. 2, dated Dec. 26, 2024. English Translation.
(Continued)

*Primary Examiner* — Moazzam Hossain
(74) *Attorney, Agent, or Firm* — Sam Pierce

(57) ABSTRACT

Provided is an atomic-smooth device with a microstructure. The device includes, from the bottom to top, a substrate, a bonding material, a second dielectric layer on the substrate, the microstructure, and a first dielectric layer, where a surface of the first dielectric layer is an atomic-smooth surface. Further provided is a method for preparing an atomic-smooth device with a microstructure to effectively avoid pits or burrs generated when the existing microstructure is machined.

10 Claims, 5 Drawing Sheets

First dielectric layer     Microstructure     Second dielectric layer

Step 1 Grow a first dielectric layer on a surface of a two-dimensional material to obtain an atomic-smooth film → Step 2 Prepare the microstructure on the first dielectric layer by micromachining → Step 3 Grow a second dielectric layer on the microstructure

Step 6 Mechanically peel off the two-dimensional material to obtain a substrate with a small amount of residual two-dimensional material, the first dielectric layer, the microstructure, the second dielectric layer, and the bonding material ← Step 5 Connect the second dielectric layer to a substrate through the bonding material ← Step 4 Coat a bonding material on the second dielectric layer

Step 7 Etch the structure by oxygen plasma → Step 8 Obtain the atomic-smooth device with the microstructure

(52) U.S. Cl.
CPC ... *B81B 2203/04* (2013.01); *B81C 2201/0102* (2013.01); *B81C 2201/0132* (2013.01); *B81C 2201/014* (2013.01); *B81C 2201/0181* (2013.01); *B81C 2203/0136* (2013.01); *B81C 2203/032* (2013.01)

(58) Field of Classification Search
CPC ...... B81C 2201/014; B81C 2201/0181; B81C 2203/0136; B81C 2203/032; B81C 1/00611; B81C 2201/0126
USPC ........................................................ 438/455
See application file for complete search history.

(56) References Cited

U.S. PATENT DOCUMENTS

| | | | | |
|---|---|---|---|---|
| 2013/0017323 A1* | 1/2013 | Garces | .................. | C23C 16/403 |
| | | | | 977/932 |
| 2013/0277777 A1* | 10/2013 | Chang | ....................... | B81C 1/00 |
| | | | | 438/51 |
| 2016/0141528 A1* | 5/2016 | Masuyama | ............ | H10K 77/10 |
| | | | | 257/40 |
| 2016/0372141 A1 | 12/2016 | Zheng et al. | | |
| 2017/0077438 A1* | 3/2017 | Lee | ....................... | H10K 50/814 |
| 2020/0126846 A1* | 4/2020 | Peidous | .............. | H10P 90/1914 |

FOREIGN PATENT DOCUMENTS

| | | | |
|---|---|---|---|
| CN | 105679647 | A | 6/2016 |
| CN | 106399929 | A | 2/2017 |
| CN | 106896088 | A | 6/2017 |
| CN | 108456850 | A | 8/2018 |
| CN | 109148157 | A | 1/2019 |
| CN | 109585269 | A | 4/2019 |
| CN | 109949832 | A | 6/2019 |
| CN | 110146113 | A | 8/2019 |
| CN | 110350819 | A | 10/2019 |
| CN | 110542942 | A | 12/2019 |
| CN | 213738598 | U | 7/2021 |
| CN | 110350819 | B * | 10/2022 ............... H02N 1/00 |
| JP | 4528124 | B2 | 8/2010 |
| JP | 6206729 | B2 | 10/2017 |
| JP | 2018202508 | A | 12/2018 |
| JP | 2019522348 | A | 8/2019 |
| KR | 20130132103 | A | 12/2013 |
| KR | 101723769 | B1 | 4/2017 |
| KR | 20180091569 | A | 8/2018 |
| KR | 20190004940 | A | 1/2019 |
| KR | 20190113564 | A | 10/2019 |

OTHER PUBLICATIONS

Japanese Notice of Allowance issued by the Japanese Patent Office in connection with International Application No. 2022-559671, dated Oct. 5, 2023. English Translation.
Korean Notice of Allowance issued by the Korean Patent Office in connection with International Application No. 10-2022-7039171, dated Feb. 5, 2025. English Translation.
Chinese Office Action issued by the Chinese Patent Office in connection with International Application No. 202080092515.2, dated Aug. 19, 2024.
Xuanyu Huang, et al., "Theoretical study of superlubric nanogenerators with superb performances", Nano Energy 70, pp. 1-6, Jan. 14, 2020.
Zheng Quanli, et al., "Superlubrication: The World of "Zero" Friction", China Academic Journal Electronic Publishing House, pp. 1-15, Apr. 28, 2016.
Zhang Xing-Wang, et al., "Research Progress of Direct Growth of Two-Dimensional Hexagonal Boron Nitride on Dielectric Substrates", Journal of Inorganic Materials, pp. 1-12, Dec. 2019.
International Search Report issued by the China National Intellectual Property Administration in connection with PCT/CN2020/098480, dated Mar. 25, 2021.
European Serach Report issued by the European Patent Office in connection with International Application No. 20942599.0, dated Mar. 31, 2023.
Qinke Wu, et al., "In situ chemical vapor desposition of graphene and hexagonal boron nitride heterostructures", Current Applied Physics, pp. 1-17, 2016.

* cited by examiner

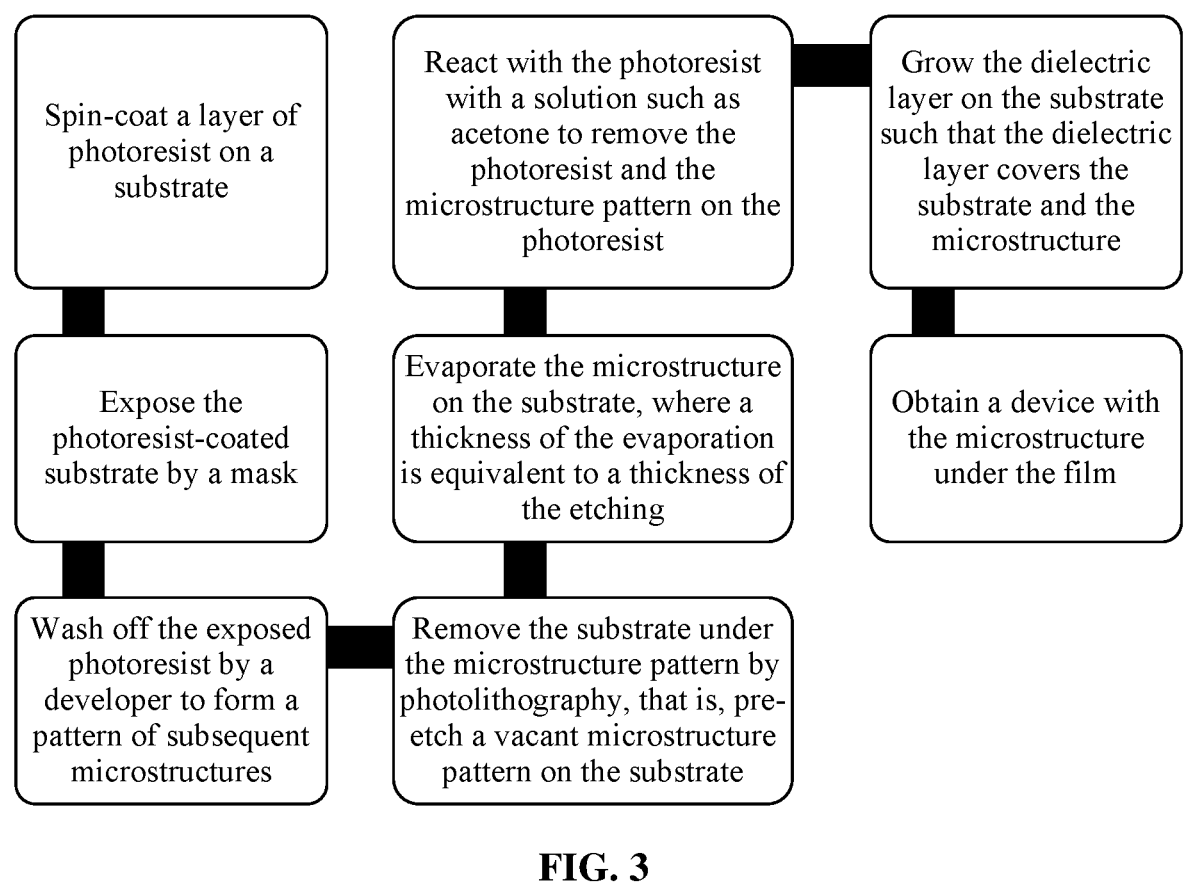

Spin-coat a layer of photoresist on a substrate

React with the photoresist with a solution such as acetone to remove the photoresist and the microstructure pattern on the photoresist Grow the dielectric layer on the substrate such that the dielectric layer covers the substrate and the microstructure Expose the photoresist-coated substrate by a mask Evaporate the microstructure on the substrate, where a thickness of the evaporation is equivalent to a thickness of the etching Obtain a device with the microstructure under the film Wash off the exposed photoresist by a developer to form a pattern of subsequent microstructures Remove the substrate under the microstructure pattern by photolithography, that is, pre-etch a vacant microstructure pattern on the substrate

FIG. 3

ATOMIC-SMOOTH DEVICE WITH MICROSTRUCTURE, AND METHOD FOR PREPARING SAME

CROSS REFERENCE TO RELATED APPLICATION

This is a national stage application filed under 37 U.S.C. 371 based on International Patent Application No. PCT/CN2020/098480, filed on Jun. 28, 2020, and disclosure of which is incorporated herein by reference in its entirety.

TECHNICAL FIELD

The present disclosure relates to the technical field of micro-nano processing and, in particular, to an atomic-smooth device with a microstructure and a method for preparing the same.

BACKGROUND

With the continuous progress of current technology, the atomic-smooth surface is widely applied to various devices, such as the magnetic disk in hard disk drive, and an integrated circuit chip. The atomic-smooth surface refers to a surface which does not have steps exceeding the atomic scale. Atomic-smooth surface has many excellent properties and ultralow undulations which allow for extremely precise control.

At the same time, with the development of technology and human requirements, the miniaturization of devices has become a development trend. As the devices become smaller and smaller, the wear and energy consumption caused by friction is increasing. After the world's first micromotor was manufactured, the micromotor only ran for about 1 minute before failing due to wear. On the other hand, how to supply power to miniaturized devices is also an important research filed. Existing micro-generators, such as triboelectric nano-generators, inevitably lead to friction and wear due to the limitation of the internal mechanism, thereby shortening the service life, and the energy loss also limits the output power of the generators. If the structural superlubricity (SSL) technology is applied to the micro-generator, the service life and output power of the generator would be greatly improved due to characteristics of the SSL technology with ultralow friction and non-wear.

A capacitive superlubricity generator is a new type of micro-generator that utilizes the principle of capacitor power generation in conjunction with the SSL characteristic. From the perspective of theoretical calculation, the power generation efficiency is very high, the current density is at least 100 times the highest density of existing micro-generators, and the service life is unlimited long. The capacitive superlubricity generator is a future micro-generator with great advantages. However, to achieve the capacitive superlubricity generator, a large area (about $100\times100$ $\mu m^2$) of atomic-smooth surface with a microstructure needs to be prepared.

The existing processes for preparing a smooth surface include etching, sacrificial layer method, direct deposition, and the like. However, since the microstructure and the smooth surface are heterogeneous materials, some burrs or pits often exist at the junction of the materials, causing the junction to be not smooth, and the undulation is about tens of nanometers so that the atomic-smooth surface cannot be formed on the final device surface with the microstructure, especially at the edge. To further solve the above-mentioned burrs and pits or achieve a smooth surface, high-precision polishing equipment and technical means are required. However, the polishing process not only requires high precision control, but also has high equipment cost, and it is also difficult to form a relatively complex atomic-smooth surface of the device with the microstructure. Therefore, a method for preparing a large-area atomic-smooth device with a microstructure which is convenient to perform must be provided to avoid problems such as the burrs/pits.

SUMMARY

To solve the preceding problems, in the present disclosure, the characteristics of a two-dimensional material with atomic-smooth and a relatively low interlayer force are utilized, under the action of an external force, a substrate and the two-dimensional material are mechanically peeled off, and a surface on which pits or burrs may appear is used as a bottom surface that is connected to the substrate through a bonding material, thereby effectively avoiding the phenomenon of pits or burrs caused by the existing micromachining process; the residual two-dimensional material may be removed by oxygen plasma etching to obtain an atomic-smooth surface with a microstructure.

An atomic-smooth device with a microstructure is provided and includes a substrate, a bonding material, a second dielectric layer on the substrate, the microstructure, and a first dielectric layer from bottom to top in sequence. A surface of the first dielectric layer is an atomic-smooth surface and has a diameter of 1 to 100 $\mu m$. The microstructure is located under a film. The microstructure and the first dielectric layer and the second dielectric layer are heterogeneous materials, and no reaction occurs between the microstructure and the dielectric layers. The edge of the atomic-smooth device has no burrs and the inner of the atomic-smooth device has no burrs or pits at least within a range of $10\times10$ $\mu m^2$.

The present disclosure further provides a method for preparing an atomic-smooth device with a microstructure. First, a first dielectric layer is grown on a surface of a two-dimensional material to obtain an atomic-smooth film, the microstructure is next prepared on the film, a second dielectric layer is grown on the microstructure and connected to a substrate, the two-dimensional material is mechanically peeled off to obtain the substrate with a small amount of residual two-dimensional material, the first dielectric layer, the microstructure, a bonding material, and the second dielectric layer. The small amount of residual two-dimensional material on the substrate is then removed by oxygen plasma etching to obtain the atomic-smooth device with the microstructure under the film. The preparation process may effectively avoid edge burrs or pits caused by traditional microstructure machining and can prepare a large-area atomic-smooth device with a scale of hundreds of microns.

A method for preparing an atomic-smooth device with a microstructure includes steps described below.

In step 1, a first dielectric layer is grown on a surface of a two-dimensional material to obtain an atomic-smooth film.

In step 2, the microstructure is prepared on the first dielectric layer by micromachining.

In step 3, a second dielectric layer is grown on the microstructure.

In step 4, a bonding material is coated on the second dielectric layer.

In step 5, the second dielectric layer is connected to a substrate through the bonding material.

In step 6, the two-dimensional material is mechanically peeled off to obtain a structure having a small amount of residual two-dimensional material, the first dielectric layer, the microstructure, the second dielectric layer, and the bonding material.

In step 7, the small amount of residual two-dimensional material on the structure is removed by oxygen plasma etching.

In step 8, the atomic-smooth device with the microstructure is obtained.

Further, the two-dimensional material is graphene or highly oriented pyrolytic graphite (HOPG).

Further, both the first dielectric layer and the second dielectric layer are preferably insulating layers and preferably silicon oxide layers.

Further, both the first dielectric layer and the second dielectric layer may be prepared by deposition.

Further, the microstructure is a metal electrode and preferably Aurum (Au), Cuprum (Cu), or Argentum (Ag).

Further, the metal electrode has a thickness of 10 to 150 nm and preferably 20 to 50 nm.

Further, the bonding material is selected from at least one of ultraviolet (UV)-curable glue or resin.

Further, the substrate is selected from one or a combination of Silicon (Si), Silicon Carbide (SiC), Silicon-On-Insulator (SOI), sapphire, mica, graphene, or molybdenum disulfide.

Further, the atomic-smooth film has a diameter of 1 μm to 100 μm.

(1) In the present disclosure, a polishing process is not performed on surfaces of heterogeneous structures, thereby avoiding the use of ultra-high-demand polishing equipment and processing technology in order to obtain a superlubricity smooth surface.

(2) In the present disclosure, the characteristics of the two-dimensional material with atomic-smooth and a relatively low interlayer force are utilized, layers can be peeled off from each other, and in a process of mechanically peeling off the substrate and the two-dimensional material under the action of an external force, the two-dimensional material is inevitably sheared and attached to the first dielectric layer, thereby ensuring the integrity of the required structure; the surface on which pits or burrs may appear is used as the bottom surface that is connected to the substrate through the bonding material, thereby effectively avoiding the phenomenon of pits or burrs caused by the existing micromachining process; the residual two-dimensional material may be removed by oxygen plasma etching, and the oxygen plasma does not react with the dielectric layers and does not damage a surface of a target film. The atomic-smooth and smooth device is obtained and has a diameter of up to 100 μm, and the microstructure is under the film. The preparation method in the present disclosure is simple and convenient, so as to effectively avoid pits or burrs generated when the existing microstructure is machined.

(3) In the present disclosure, the atomic-smooth of the surface of the two-dimensional material is also utilized, that is, the smooth surface of the two-dimensional material (such as graphene) may be equivalent to the smooth surface of the first dielectric layer grown on the two-dimensional material correspondingly, thereby ensuring broad applicability.

DESCRIPTION OF DRAWINGS

FIG. 3 is a flowchart illustrating preparation of a device with a microstructure through the existing process;

DETAILED DESCRIPTION

Figure 1:
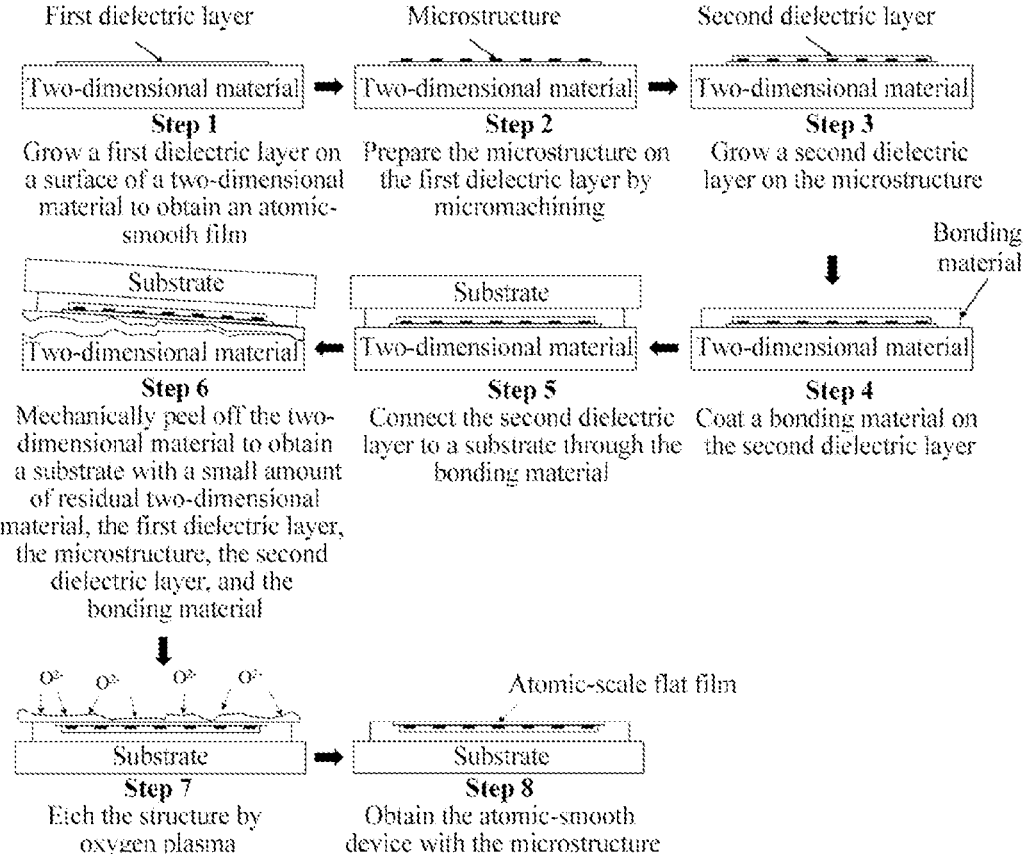
FIG. 1 is a flowchart illustrating preparation process steps of an atomic-smooth device with a microstructure under a film according to present disclosure.

Embodiment for Preparation of an Atomic-Smooth Device with Metal Electrodes Under a Film A structure shown in step 8 of FIG. 1 is an atomic-smooth device with a metal electrode in this embodiment. The device includes, from bottom to top, a sapphire substrate, ultraviolet (UV)-curable glue, a second silicon oxide layer on the substrate, an Au electrode array arranged according to application requirements, and a first silicon oxide layer. A surface of the first silicon oxide layer is an atomic-smooth surface and has a diameter of 1 to 100 μm, and an Au electrode array under the first silicon oxide layer does not react with the first silicon oxide layer and the second silicon oxide layer. The edge of the atomic-smooth device has no burrs and the inner of the atomic-smooth device has no protrusions or pits at least within a range of 10 μm×10 μm.

Figure 2:
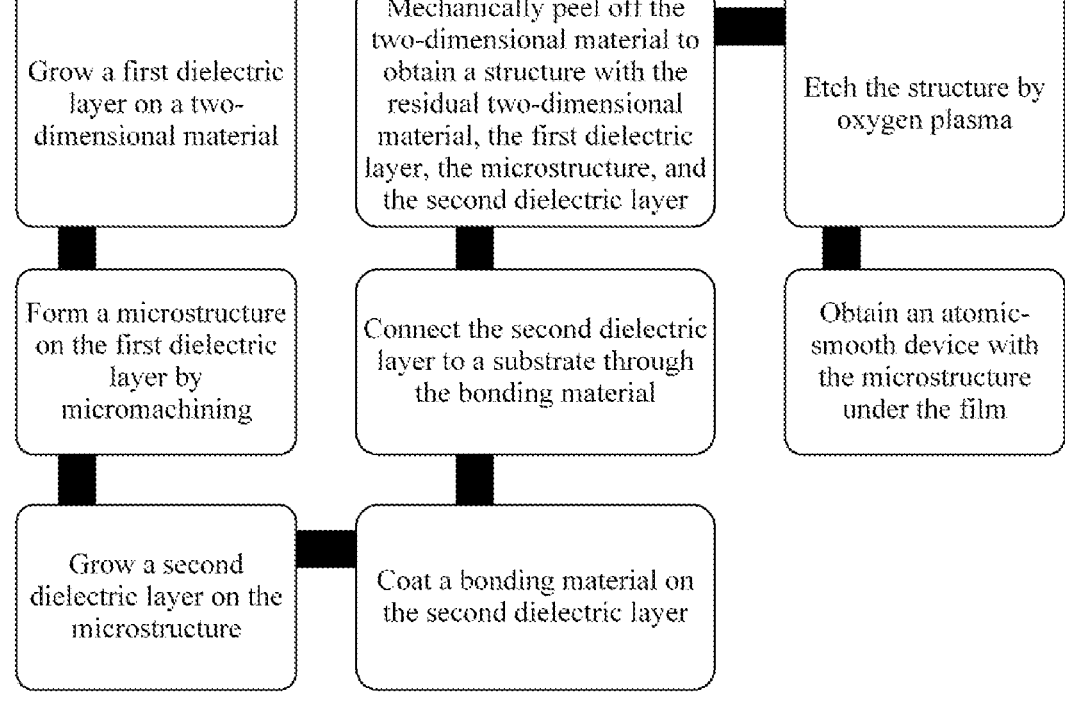
FIG. 2 is a flowchart illustrating preparation of an atomic-smooth device with a microstructure under a film according to present disclosure.

In conjunction with FIGS. 1 and 2, a method for preparing a device according to an embodiment of the present disclosure is described, and the case where silicon oxide is used as insulating dielectric material, Au is used as a metal electrode, UV-curable glue is used as the binder, and sapphire is used as the substrate is used as an example. As shown in FIG. 1, first, HOPG is dissociated to obtain a new smooth surface; a 100 nm-thick first dielectric layer silicon oxide is next grown on the new smooth surface at low temperature; metal electrode plates of a capacitive superlubricity generator such as a 6×6×0.2 μm³ Au electrode array with an electrode interval of 6 μm are then made on silicon oxide; a 500 nm-thick second dielectric layer silicon oxide is then grown at low temperature and can completely cover the Au electrode array; a drop of UV-curable glue is then dripped on a silicon oxide surface of the second dielectric layer, and a glue dispenser is used to make the glue thickness about 100 μm; the UV-curable glue is then covered with a 1 mm-thick sapphire sheet with a size equivalent to the HOPG, the UV-curable glue is irradiated with a UV lamp so that the UV-curable glue and the sapphire sheet are bonded, and after irradiated for 1 min, the UV-curable glue is cured; since the HOPG is a layered material and the interlayer dissociation energy is relatively low, when the HOPG and sapphire are dissociated by the mechanical peeling method, the UV-curable glue, the second dielectric layer silicon oxide, Au electrodes, a silicon oxide film of the first dielectric layer, and part of the HOPG remain on the sapphire; the residual HOPG on the sapphire is finally bombarded with $O^{2-}$-Plasma, and the bombardment time depends on the thickness of the residual HOPG. $O^{2-}$ does not react with silicon oxide, so after the HOPG is removed, a large-area atomic-smooth device with metal electrodes under the film may be obtained. The surface of the device is observed to be atomic-smooth under an atomic force microscope.

The large-area atomic-smooth device with the microstructure under the film prepared and obtained in the present disclosure has a diameter of up to 100 μm. The preparation method is simple and convenient, so as to effectively avoid pits or burrs generated when the existing microstructure is machined. Since a polishing process is not performed on surfaces of heterogeneous structures, the use of ultra-high-demand polishing equipment and processing technology in order to obtain a superlubricity smooth surface is avoided, thereby ensuring wide applicability.

Comparative Embodiment for Preparation of a Device with Metal Electrodes by the Existing Etching Method In conjunction with FIGS. 3, 4 and 5, the preparation method and effect in the comparative embodiment of the present disclosure are described below, and the case of a silicon oxide substrate and Au electrodes is used as an example. FIG. 3 is a flowchart illustrating preparation of a device with a microstructure through the existing process. A layer of photoresist is first spin-coated on the silicon oxide substrate, a mask is used to expose the photoresist-coated substrate, and then a developer is used to wash off the exposed photoresist to form the pattern of the subsequent metal electrodes; then photolithography is performed to remove the silicon oxide of the metal electrode pattern on the silicon oxide substrate, that is, the vacant metal electrode pattern is pre-etched; then Au is evaporated on the vacant silicon oxide substrate, and a thickness of the evaporation is approximately the same as a thickness of the etching; then peeling off is performed, that is, a solution such as acetone is used to react with the photoresist to remove the photoresist and Au evaporated on the photoresist; then an insulating layer of silicon oxide is grown on the substrate to cover Au and silicon oxide.

Figure 4:
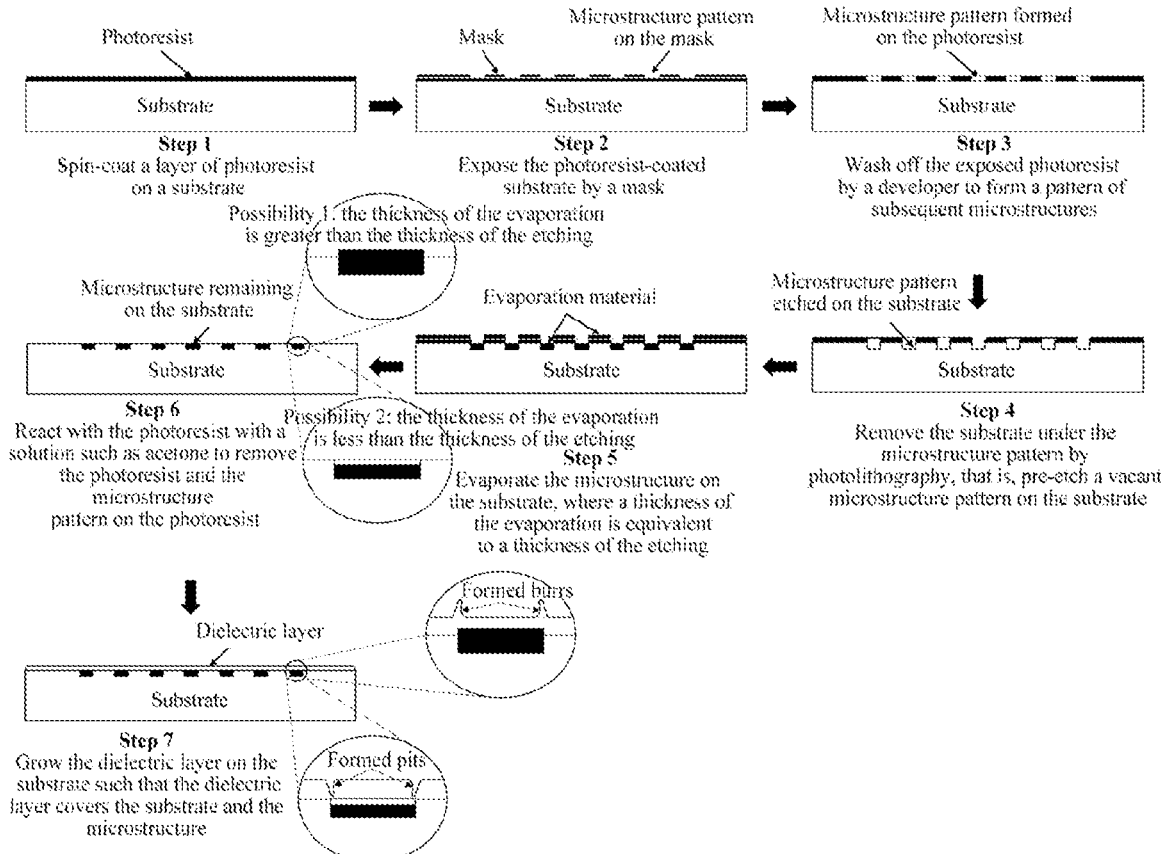
FIG. 4 is a schematic diagram illustrating that burrs and pits are generated during preparation of an atomic-smooth device through an existing etching method.
Figure 5:
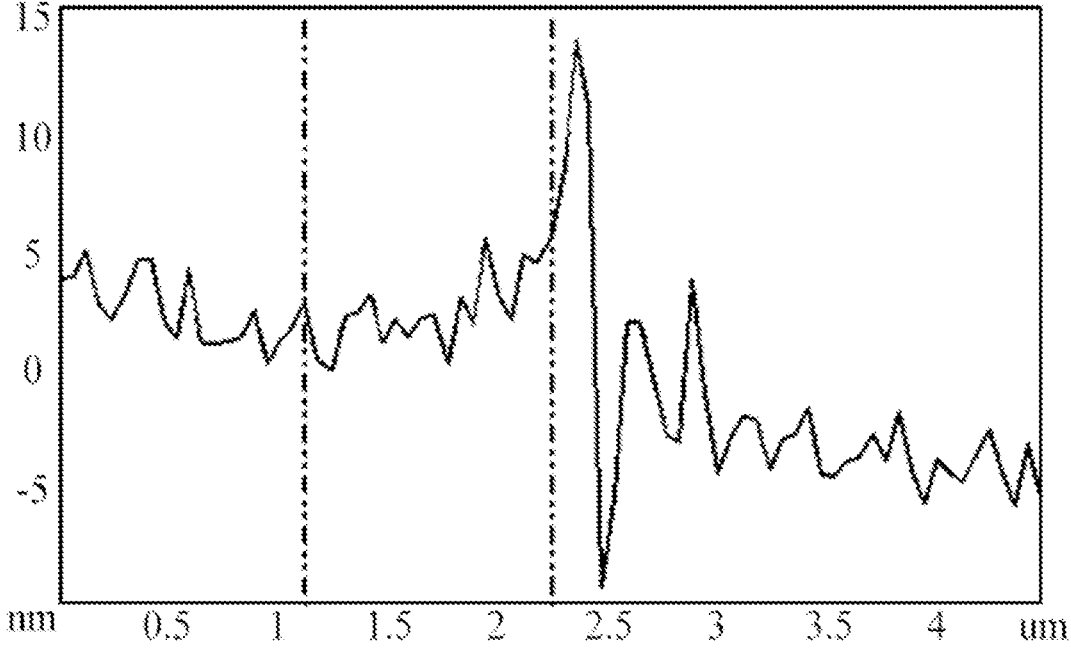
FIG. 5 is an atomic force microscopy (AFM) scanning sectional diagram of a device surface obtained through an existing etching method.

FIG. 4 is a schematic diagram illustrating that burrs and pits are generated during preparation of an atomic-smooth device through an existing etching method. Due to different adsorption properties of the grown silicon oxide for Au and the silicon oxide substrate, growth rates of the grown silicon oxide on Au and the silicon oxide substrate are also different, resulting in some burrs or pits at the junction of Au and the silicon oxide substrate, thereby causing the junction to be not smooth. As shown in FIG. 5, the undulation is about tens of nanometers so that the atomic-smooth surface cannot be formed on the final device surface with the microstructure, especially at the edge. That is to say, it is difficult for the heterogeneous material layer to satisfy requirements of atomic-smooth, and it is difficult to achieve the atomic-smooth device with the microstructure under the film. Therefore, from the perspective of the existing common process means, it is difficult to solve the above-mentioned tens of nanometer protrusions or burrs so that requirements of the atomic-smooth surface cannot be satisfied.

INDUSTRIAL APPLICABILITY

The above are only preferred embodiments of the present disclosure. Any equivalent variations or modification made according to the scope of the claims in the present disclosure should belong to the coverage scope of the claims in the present disclosure.

What is claimed is:

1. A method for preparing an atomic-smooth device with a microstructure, wherein the atomic-smooth device with the microstructure comprises a substrate, a bonding material, a second dielectric layer on the substrate, the microstructure, and a first dielectric layer in sequence, wherein a surface of the first dielectric layer is an atomic-smooth surface, the method comprises:

in step 1, growing the first dielectric layer on a surface of a two-dimensional material to obtain an atomic-smooth film, wherein the two-dimensional material is graphene or highly oriented pyrolytic graphite (HOPG);

in step 2, preparing the microstructure on a surface of the first dielectric layer facing away from the two-dimensional material by micromachining;

in step 3, growing the second dielectric layer on a surface of the microstructure facing away from the first dielectric layer;

in step 4, coating the bonding material on the second dielectric layer;

in step 5, connecting the second dielectric layer to the substrate through the bonding material;

in step 6, peeling off the two-dimensional material to obtain a structure having a small amount of residual two-dimensional material, the first dielectric layer, the microstructure, the second dielectric layer, and the bonding material;

in step 7, removing the small amount of residual two-dimensional material on the structure by oxygen plasma etching; and in step 8, obtaining the atomic-smooth device with the microstructure.

2. The method of claim 1, wherein both the first dielectric layer and the second dielectric layer are insulating layers.

3. The method of claim 1, wherein the microstructure is a metal electrode, and the metal electrode has a thickness of 10 to 150 nm.

4. The method of claim 1, wherein the bonding material is selected from at least one of ultraviolet (UV)-curable glue or resin.

5. The method of claim 1, wherein the substrate is selected from one or a combination of Silicon (Si), Silicon Carbide (SiC), Silicon-On-Insulator (SOI), sapphire, mica, graphene, or molybdenum disulfide.

6. The method of claim 1, wherein the atomic-smooth film has a diameter of 1 μm to 100 μm.

7. The method of claim 2, wherein the first dielectric layer and the second dielectric layer are silicon oxide layers and are prepared by deposition.

8. The method of claim 3, wherein the microstructure is Aurum (Au), Cuprum (Cu), or Argentum (Ag).

9. The method of claim 3, wherein the metal electrode has a thickness of 20 to 50 nm.

10. The method of claim 1, wherein a projection of the first dielectric layer on the two-dimensional material covers a projection of the second dielectric layer on the two-dimensional material.

* * * * *